(12) United States Patent
Costigan

(10) Patent No.: US 10,302,228 B2
(45) Date of Patent: May 28, 2019

(54) CABLE CLIP

(71) Applicant: Mark Costigan, Wallsend Tyne and Wear (GB)

(72) Inventor: Mark Costigan, Wallsend Tyne and Wear (GB)

( * ) Notice: Subject to any disclaimer, the term of this patent is extended or adjusted under 35 U.S.C. 154(b) by 0 days.

(21) Appl. No.: 15/826,894

(22) Filed: Nov. 30, 2017

(65) Prior Publication Data

US 2018/0080579 A1    Mar. 22, 2018

Related U.S. Application Data

(63) Continuation-in-part of application No. 14/408,033, filed as application No. PCT/GB2013/050309 on Feb. 11, 2013, now abandoned.

(30) Foreign Application Priority Data

Feb. 21, 2012  (GB) .................................... 1202946.8
Dec. 19, 2012  (GB) .................................... 1223018.1

(51) Int. Cl.
    *F16L 3/00*     (2006.01)
    *F16L 3/223*     (2006.01)
    (Continued)

(52) U.S. Cl.
    CPC ............ *F16L 3/223* (2013.01); *F16L 3/1075* (2013.01); *H02G 3/30* (2013.01); *H04Q 1/06* (2013.01); *H05K 7/1491* (2013.01)

(58) Field of Classification Search
    CPC ......... Y10T 24/44786; Y10T 24/44376; Y10T 24/44385; Y10T 24/44393; Y10T 24/44402; Y10T 24/44427; Y10T 24/44436; Y10T 24/44444; Y10T 24/44462; Y10T 24/44447; Y10T 24/44479; Y10T 24/44564; Y10T 24/44641; Y10T 24/44769; Y10T 24/3444;
(Continued)

(56) References Cited

U.S. PATENT DOCUMENTS 1,816,301 A     7/1931   Sundell
2,532,674 A     12/1950   Nelsen
(Continued)

FOREIGN PATENT DOCUMENTS

DE         8213664 U1     7/1982
DE     202010017007 U1     6/2012
(Continued)

OTHER PUBLICATIONS

Patents Act 1997: Search Report under Section 17(5), Application No. GB1223018.1, dated Jul. 19, 2013.
(Continued)

*Primary Examiner* — Jack W Lavinder
(74) *Attorney, Agent, or Firm* — MacMillan, Sobanski & Todd, LLC

(57) ABSTRACT

A cable clip configured to receive a plurality of cables comprises a plurality of cable receiving openings each adapted to grip a cable located therein. The clip comprises a first member and a second member, each member including a part of each said opening. Each part of an opening in one of the members align with a corresponding part of an opening in the other of the members.

10 Claims, 9 Drawing Sheets

(51) Int. Cl.
*F16L 3/10* (2006.01)
*H04Q 1/06* (2006.01)
*H02G 3/30* (2006.01)
*H05K 7/14* (2006.01)

(58) Field of Classification Search
CPC ....... F16L 3/223; F16L 3/2235; F16L 3/1075; F16L 3/1083; F16L 3/1203; F16L 3/237; H02G 3/30; H02G 3/32; H02G 3/263; H04Q 1/06; H05K 7/1491
USPC .......................................................... 24/570
See application file for complete search history.

(56) References Cited

U.S. PATENT DOCUMENTS

| | | | |
|---|---|---|---|
| 3,287,776 A | 11/1966 | Brown | |
| 3,421,187 A | 1/1969 | Ryder | |
| 3,766,925 A * | 10/1973 | Rubricius | A61B 17/122 |
| | | | 24/543 |
| 4,617,775 A | 10/1986 | Padrun | |
| 4,775,121 A | 10/1988 | Carty | |
| 5,060,810 A | 10/1991 | Jones | |
| 5,389,082 A * | 2/1995 | Baugues | A61M 5/1418 |
| | | | 128/DIG. 26 |
| 5,653,411 A | 8/1997 | Picco et al. | |
| 7,457,506 B1 * | 11/2008 | Osborne, II | F16L 3/2235 |
| | | | 248/68.1 |
| 2007/0215757 A1 | 9/2007 | Yuta | |
| 2009/0140108 A1 | 6/2009 | Faied | |
| 2010/0163278 A1 | 7/2010 | Grelck | |
| 2011/0308046 A1 | 12/2011 | Weiss | |
| 2012/0006947 A1 | 1/2012 | Gundel et al. | |
| 2015/0176725 A1 * | 6/2015 | Wu | F16L 3/01 |
| | | | 438/745 |

FOREIGN PATENT DOCUMENTS

| | | |
|---|---|---|
| EP | 0638756 A1 | 2/1995 |
| EP | 2068063 A2 | 6/2009 |
| GB | 1224535 | 3/1971 |
| WO | 2008072004 A1 | 6/2008 |
| WO | 2012101216 A1 | 8/2012 |

OTHER PUBLICATIONS

PCT International Search Report, Application No. PCT/GB2013/050309, dated Jan. 8, 2014.

* cited by examiner

FIGURE 1a
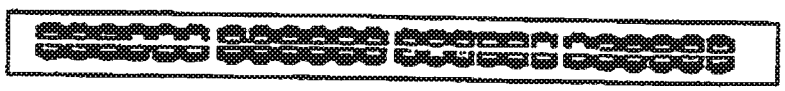
FIGURE 1b
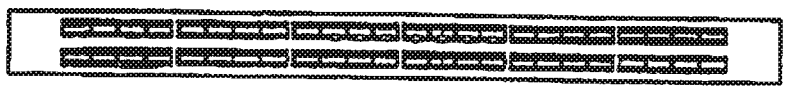
FIGURE 1c
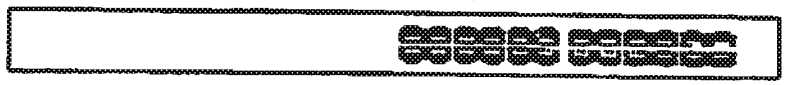

FIGURE 1f

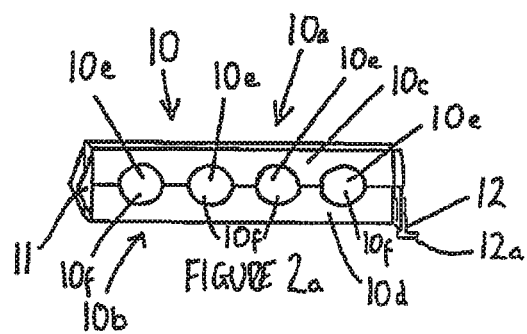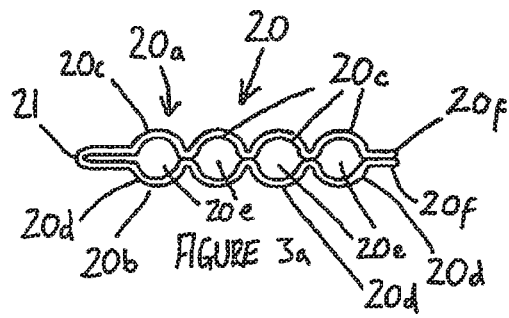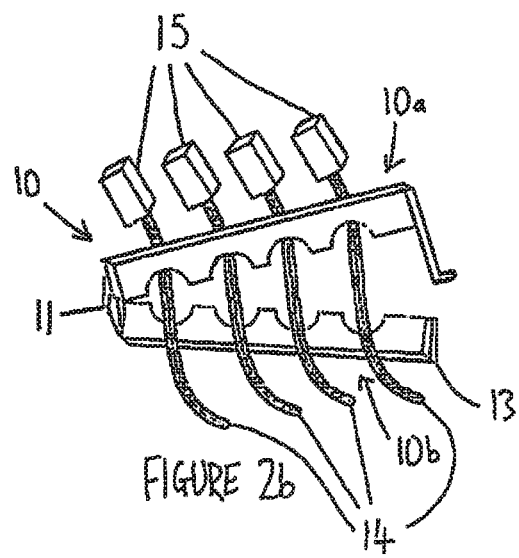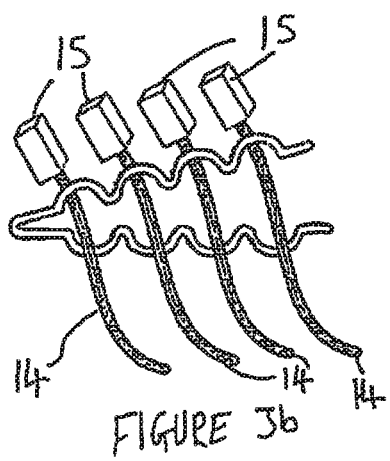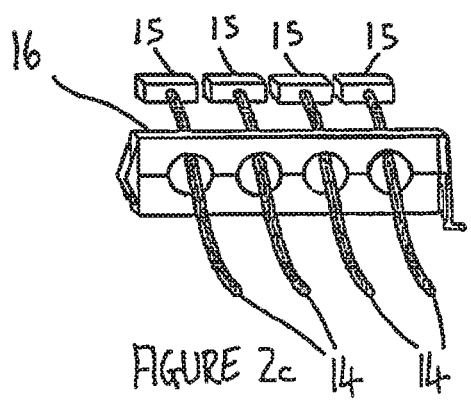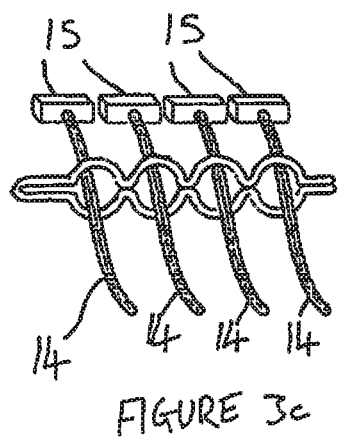

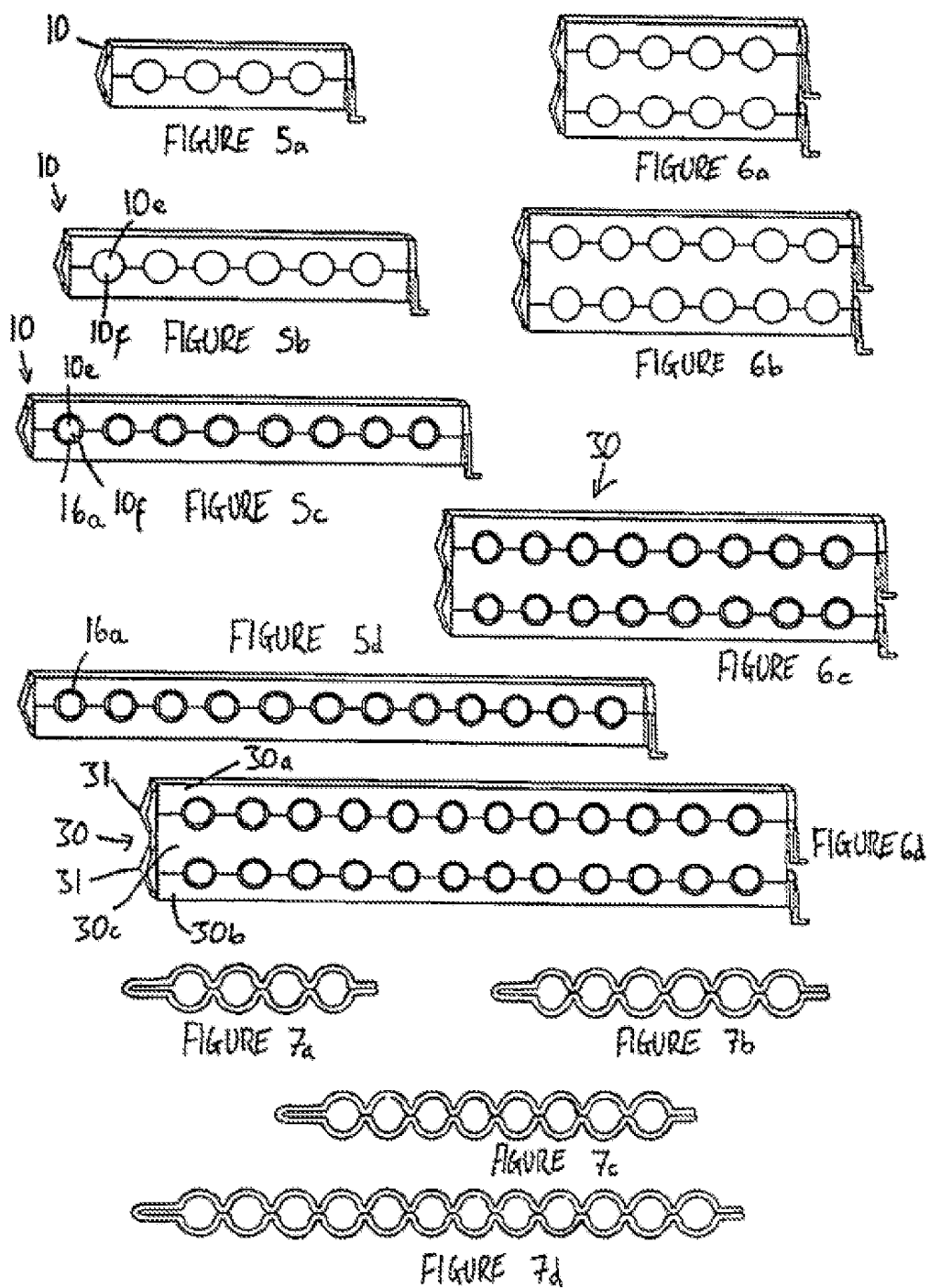

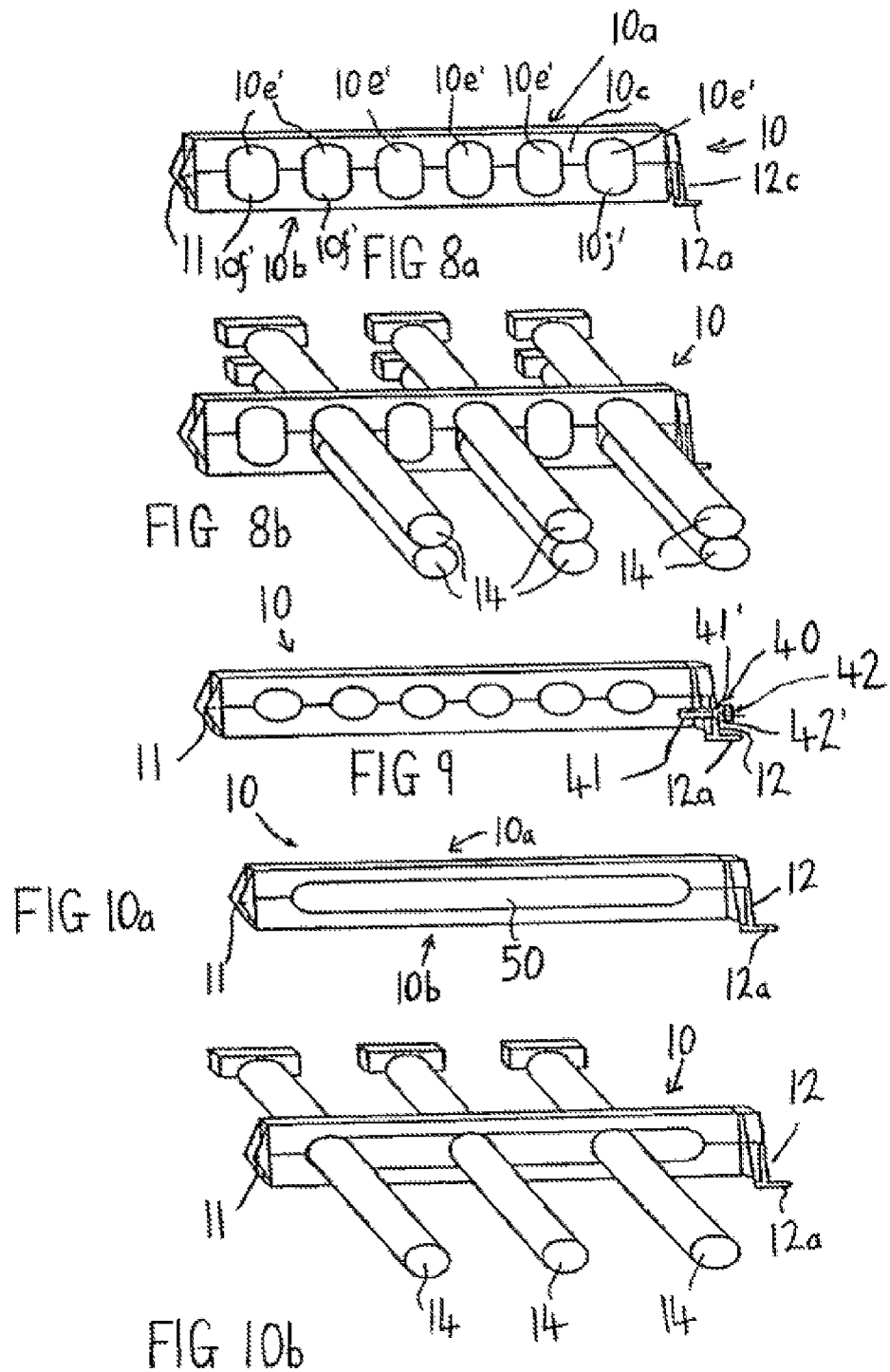

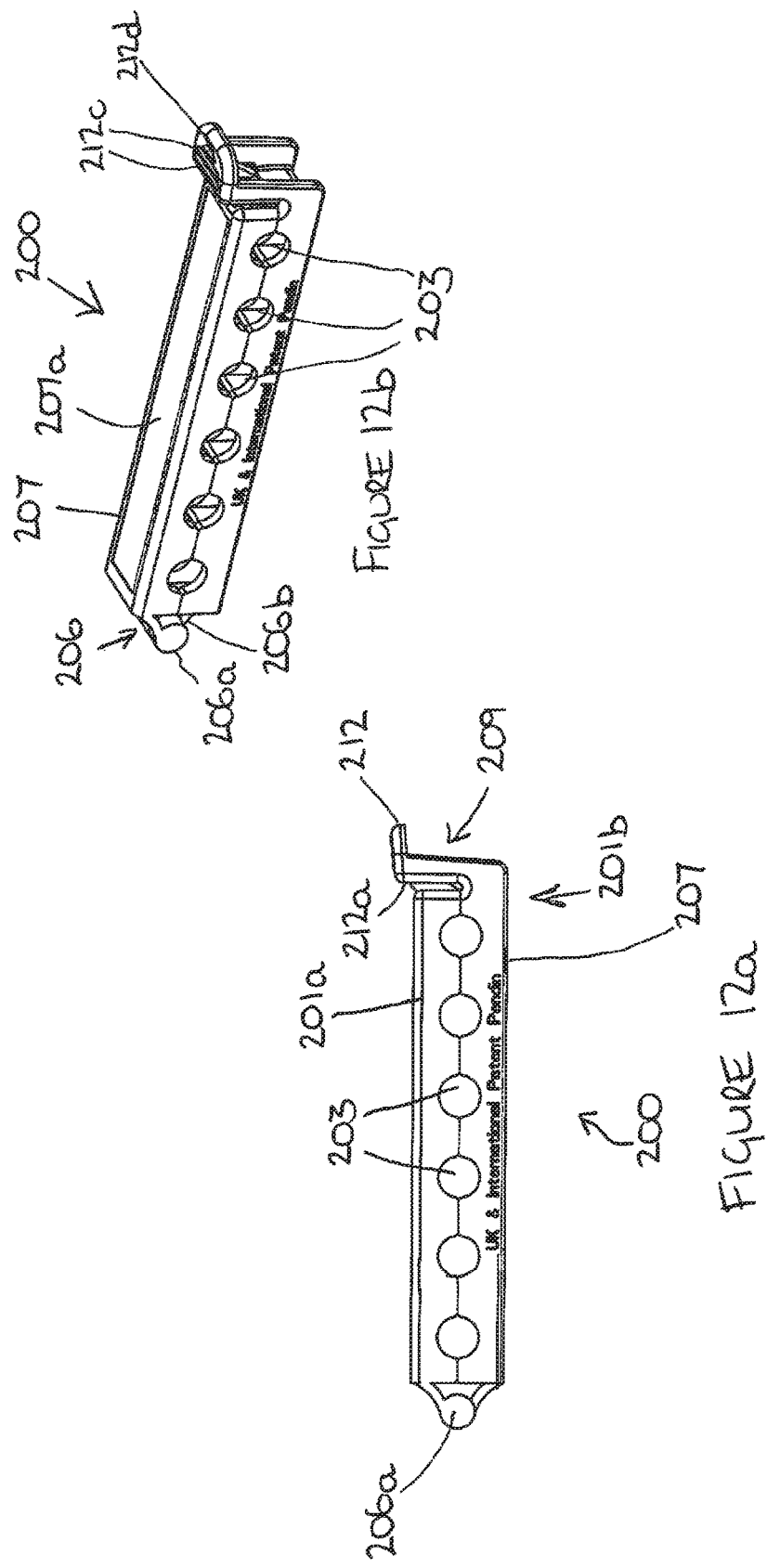

CABLE CLIP

CROSS-REFERENCE TO RELATED APPLICATIONS

This application is a continuation-in-part patent application of U.S. patent application Ser. No. 14/408,033, filed Dec. 15, 2014, which was the National Phase of International Application PCT/GB2013/050309 filed Feb. 11, 2013, which designated the U.S. That International Application was published in English under PCT Article 21(2) on Aug. 29, 2013 as International Publication Number WO2013/124621A1. PCT/GB2013/050309 claims priority to U.K. Application No. 1202946.8 filed Feb. 21, 2012 and to U.K. Application No. 1223018.1 filed Dec. 19, 2012. Thus, the subject nonprovisional application also claims priority to U.K. Application No. 1202946.8 filed Feb. 21, 2012 and to U.K. Application No. 1223018.1 filed Dec. 19, 2012. The disclosures of all of these applications are incorporated herein by reference.

BACKGROUND OF THE INVENTION

The present invention relates to a cable clip and in particular to a clip for holding a plurality of cables, in a particular relationship to one another.

The main connection point into a computer network is via network switches. Devices such as servers, storage, computers, printers and other end user devices connect to the network by the means of a network switch, typically using copper or fiber Ethernet cables. End devices use a local port in the wall or floor, the building cabling is then terminated on patch panels in a communications cabinet. It is there where a vast amount of network cables are used to connect from patch panel to network switch. Also in computer data centers a multitude of network switches connect back to larger distribution or core network switches in the most commonly used network architecture model. Virtualization is now common place in today's data centers which also means that many servers have their own network switches built in, which now increases the number of cables that need to be managed. In larger end user locations and data centers, hundreds of cables connect into network switches in each communications cabinet.

If there is a requirement to carryout work on a network switch it may be necessary to remove some or all of the cables connected to one or more sets of network switch ports. Typically, a network has accompanying documentation in which the network architecture is recorded. Sometimes a technician is tasked with replacing a particular network switch, due to failure, upgrade or some other reason. When this replacement is required, before removing the cables from the switch, each cable must be labelled. Even if the documentation is deemed to be up to date, each cable is usually checked and re-documented or a confirmation of location is recorded before removing the cable for the work to take place. This takes considerable time and usually involves two technicians, one labelling individual cables and the other checking and updating the network architecture documentation to speed up the task.

Even in a well maintained communications cabinet the vast amount of cables makes the task of removing and refitting a number of cables from and to specific configured switch ports a difficult and time consuming task. It is also common place to find that cables running into a communications cabinet do so in an untidy manner, which makes the task even more difficult and takes even more time.

Network switch ports tend to be grouped together, typically in fours or multiples of four, sixes or multiples of sixes, and eights or multiples of eight. For example, a forty-eight network switch may comprise of four columns each comprising two 6 port switch modules mounted one above the other.

A cable retention clip is described in WO2008/072004. The clip comprises two separable parts. The cables are held in cable guide members in one part of the clip. The clip is designed to attach to tray.

It would be desirable to provide an improved means of securing a plurality of cables in a particular order. In particular it would be desirable to provide a means of securing a plurality of cables in a particular order with a particular spacing between the so secured cables.

The present invention seeks to provide such a device in the form of a clip.

SUMMARY OF THE INVENTION

According to the invention, there is provided a cable clip as specified in claim 1.

Preferred features of the invention are set out in the claims dependent on claim 1, the description and the drawings.

BRIEF DESCRIPTION OF THE DRAWINGS

FIG. 1a is a schematic representation of a forty eight port copper switch/line card;

FIG. 1b is a schematic representation of a forty eight port fiber switch/line card;

FIG. 1c is a schematic representation of a twenty four port copper switch/line card;

FIG. 1f is a schematic representation of a twelve port copper switch/line card;

FIG. 2a is a schematic representation of a cable clip according to a first embodiment of the invention;

FIG. 2b is a schematic representation of the cable clip illustrated in FIG. 2a in an open state for attachment to a group of cables;

FIG. 2c is a schematic representation of the cable clip illustrated in FIG. 2a secured with respect to the group of cables;

FIG. 3a is a schematic representation of a cable clip according to a second embodiment of the invention;

FIG. 3b is a schematic representation of the cable clip illustrated in FIG. 3a in an open state for attachment to a group of cables;

FIG. 3c is a schematic representation of the cable clip illustrated in FIG. 3a secured with respect to the group of cables;

FIGS. 5a to 5d illustrate cable clips according to the first aspect of the invention configured to receive different numbers of cables;

FIGS. 6a to 6d illustrate cable clips according to a third aspect of the invention configured to receive different numbers of cables from rows of ports stacked one on top of the other;

FIGS. 7a to 7d illustrate cable clips according to the second embodiment of the invention configured to receive different numbers of cables;

FIGS. 8a and 8b illustrate a clip according to a third embodiment of the invention;

FIG. 9 illustrates a clip according to a fourth embodiment of the invention;

FIGS. 10a and 10b illustrates a clip according to a fifth embodiment of the invention;

FIG. 12a is a side view of the cable clip illustrated in FIG. 12 in a closed configuration;

FIG. 12b illustrates the cable clip shown in FIG. 12 in a closed configuration.

DETAILED DESCRIPTION OF THE PREFERRED EMBODIMENT

Figure 1D:
FIG. 1d is a schematic representation of a twenty four port fiber switch/line card.
Figure 1E:
FIG. 1e is a schematic representation of a sixteen port copper switch/line card.
Figure 1G:
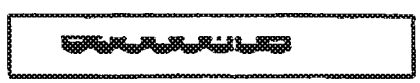
FIG. 1g is a schematic representation of an eight port copper switch/line card.

FIGS. 1a to 1g illustrate different port configurations for different types of cabling. For example, FIG. 1a illustrates a forty eight port switch/line card for copper cables, whereas FIG. 1b illustrates a forty eight port switch/line card for fiber optic cables. The respective diameters of copper and fiber optic cables differ. Also, the distance between adjacent ports differs depending on the type of wire.

It can be seen from FIGS. 1a to 1c and 1e that ports may be arranged in rows above one another.

Also, it can be seen from FIGS. 1a to 1g that ports may be grouped together in different numbers. For example, in FIG. 1b the ports are grouped together in fours, whereas in FIGS. 1a and 1c the ports are grouped together in sixes.

As will be understood by one skilled in the art of networking, that each port receives a cable, and it is essential that the correct cable is connected to the correct port due to specific configuration on each specific port.

Current methods rely on labelling individual cables and removing and replacing them one by one.

The invention seeks to provide a cable clip that allows cables to be grouped together. The invention further seeks to provide a cable clip that allows cables to be grouped together with a specific spacing between adjacent cables. The advantage of such a clip is that cables can be removed from the ports as a group and re-inserted into the ports as a group. This makes the exercise of documenting the cabling architecture much simpler since rather than each cable of the group being documented individually, a group of cables can be documented as an entity.

Also, the removal and reinsertion of the cables is made simpler, because the clip ensures that the cables are spaced apart such that if one of the cables is aligned with one of the ports, then all of the cables are aligned with all of the ports in the group.

FIGS. 2a to 2c illustrate a clip 10 comprising first and second members 10a, 10b joined together at one end by a hinge 11, a fastener 12 is provided at the other end of the first member 10a. The fastener 12 engages with a protrusion 13 of the second member 10b to fasten the clip 10 closed. The fastener 12 includes a portion 12a which the user engages to prise the fastener 12 away from the protrusion 13 to allow the clip to open.

The first and second members 10a, 10b each include a wall 10c, 10d. Each wall 10c, 10d includes a plurality of semi-circular openings 10e, 10f, which align to form circular openings as can be appreciated from FIGS. 2a and 2c in particular.

To use the clip 10 a technician takes the clip illustrated in FIG. 2a and pulls the fastener 12 away from the protrusion 13. The hinge 11 may be sprung such that the clip is inclined to open when the fastener 12 is disengaged from the protrusion 13.

The technician then passes the open clip 10 over a group of cables 14 the ends 15 of which are connected to ports. The circular openings are spaced apart such that they will readily align with the cables, because the spacing between the centers of adjacent openings is matched to the distances between the centers of adjacent ports. There is only a relatively small number of port configurations in use, so different clips may be manufactured to match the spacings of the different port configurations.

The technician closes the clip which secures the cables in position with respect to one another. For the sake of clarity, in the Figures the cables are shown having a smaller diameter than the openings in the clips in which they lie. However, practically the openings would be sized such each cable is an interference fit in the opening. This allows the clip to grip the cable. This may be achieved by providing a compressible lining to the openings, or simply fabricating the openings such that they are of substantially the same diameter as the cable. Again, there is only a small number of different diameters of cable and hence clips may be fabricated to match the different diameters of cable used.

The clip 10 is typically formed as a single or dual piece component by molding plastics, metal or other durable and flexible material.

The first member 10a includes a flat surface 16. The flat surface 16 may have a label applied with an indication of the ports to which the cables are attached. Such a label may be pre-marked or the technician may write out the label as he is working.

FIGS. 3a to 3c illustrate an alternative embodiment of the invention. The cable clip 20 is again formed from a single piece of plastic, metal or other durable and flexible material. The clip 20 includes an first and second members 20a, 20b which are joined together at a 21. The first and second members 20a, 20b each have an end 20f. To open the cable clip 20 the technician simply uses his fingers to push the first and second members 20a, 20b apart. The clip 20 may then be passed over cables 14. When the technician ceases to hold the first and second members 20a, 20b apart and they return to the closed configuration as shown in FIG. 3c.

The bend 21 in the clip 20 may have a label applied with an indication of the ports to which the cables are attached. Such a label may be pre-marked or the technician may write out the label as he is working.

Figure 4A:
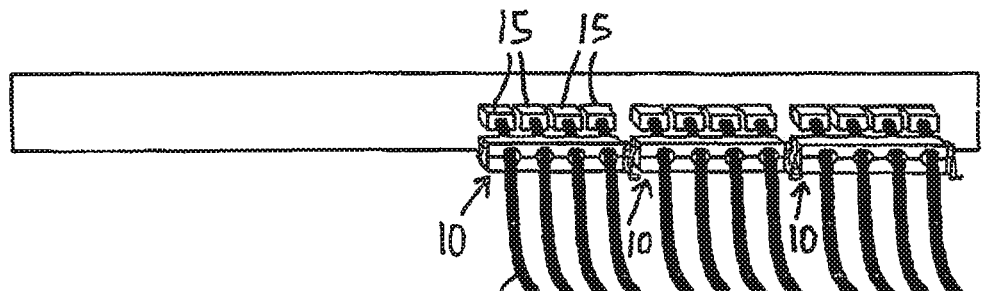
FIG. 4a is a schematic representation of the three clips according to the first aspect of the invention connected to the cables extending from three groups of four ports.
Figure 4B:
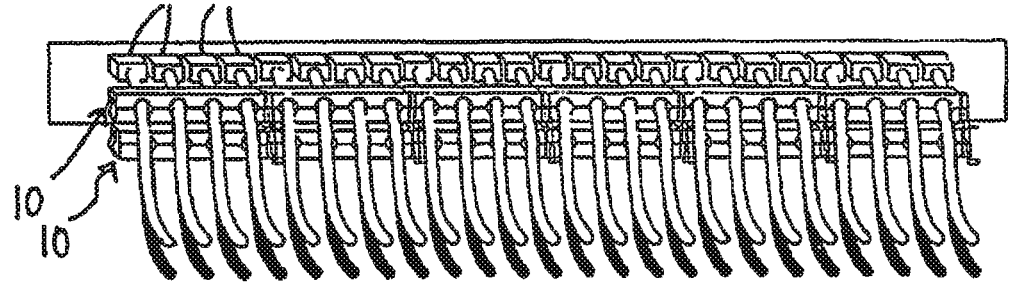
FIG. 4b is a schematic representation of twelve clips according to the first aspect of the invention connected to the cables extending from two rows of six groups of four ports.
Figure 4C:
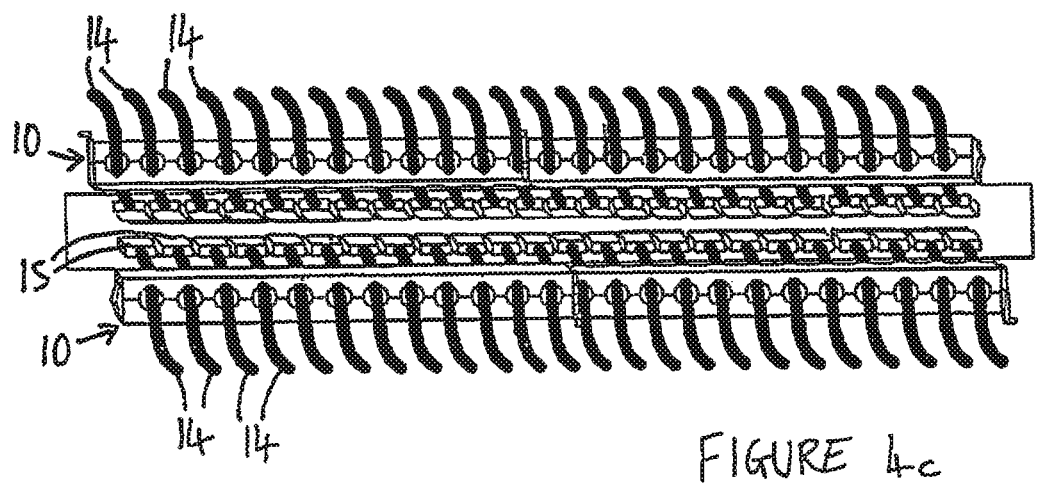
FIG. 4c is a schematic representation of the twelve clips according to the first aspect of the invention connected to the cables extending from two rows of six groups of four ports.

FIGS. 4a to 4c illustrate how the cable clips of the invention may be used.

In FIG. 4a the ports are grouped together in fours in a single row. A cable clip 10 having four openings for receiving individual cables is provided.

In FIG. 4b the ports are grouped together in fours in two rows. Again, cable clips 10 having four openings for receiving individual cables are provided.

In FIG. 4c the ports are grouped together in twelves in two rows. Cable clips 10 having twelve openings for receiving individual cables are provided.

It will be appreciated from FIGS. 4b and 4c in particular that with the cables secured in clips 10 working with the cables is simpler for a technician. For example, in FIG. 4b all the cables 14 extend downward from the ports, whereas in FIG. 4c the cables attached to the upper row of cables extend upward and from the lower row downward. Moving the upper row of cables from the position shown in FIG. 4b to that shown in FIG. 4c is much simpler with the cables clipped together using the cable clips of the invention.

FIGS. 5 to 7 illustrate three different embodiments of cable clip and for each embodiment a number of variants in terms of the number of cables each clip can receive.

FIGS. 5a to 5c illustrate the clip 10 configured to receive four, six and eight cables respectively. In FIG. 5c, each opening is lined with a compressible material 16a.

FIGS. 6a to 6d illustrate clips 30 configured to attached to cables engaged in ports arranged one row above another, with the ports grouped in fours, sixes, eights and twelves respectively.

FIGS. 7a to 7d illustrate the cable clip 20 configured to receive four, six, eight and twelve cables respectively.

FIGS. 8a and 8b illustrate a clip 10 where the openings 10e', 10f' are U-shaped in order that an aligned pair of openings 10e', 10f' may accommodate two cables 14. By increasing the depth of the parallel sided part of the U-shaped openings 10e', 10f' a greater number of cables 14 may be accommodated within an aligned pair of openings.

FIG. 9 illustrates a further alternative clip 10 featuring a lock 40 to lock together the first and second members 10a, 10b. The lock 40 comprises a bore 41 in the second member 10a and bore 41' in the fastener 12, the bores 41, 41' being aligned, and a screw 42. The bore 41 is threaded and receives the correspondingly threaded screw 42. The screw 42 has a head 42' requiring a special tool to engage therewith, thereby preventing tampering with the clip 10.

FIGS. 10a and 10b illustrate a further alternative embodiment of the invention. The clip 10 illustrated in FIGS. 10a and 10b has a single shallow U-shaped opening 50 in each of the first and second members 10a, 10b. For ease of understanding only three cables 14 are illustrated in FIG. 10b. It can be appreciated that once the clip 10 is closed, cables 14 cannot slide past one another. Equally, the openings 50 may also be filled with cables 14, adjacent cables 14 touching one another.

Figure 11:
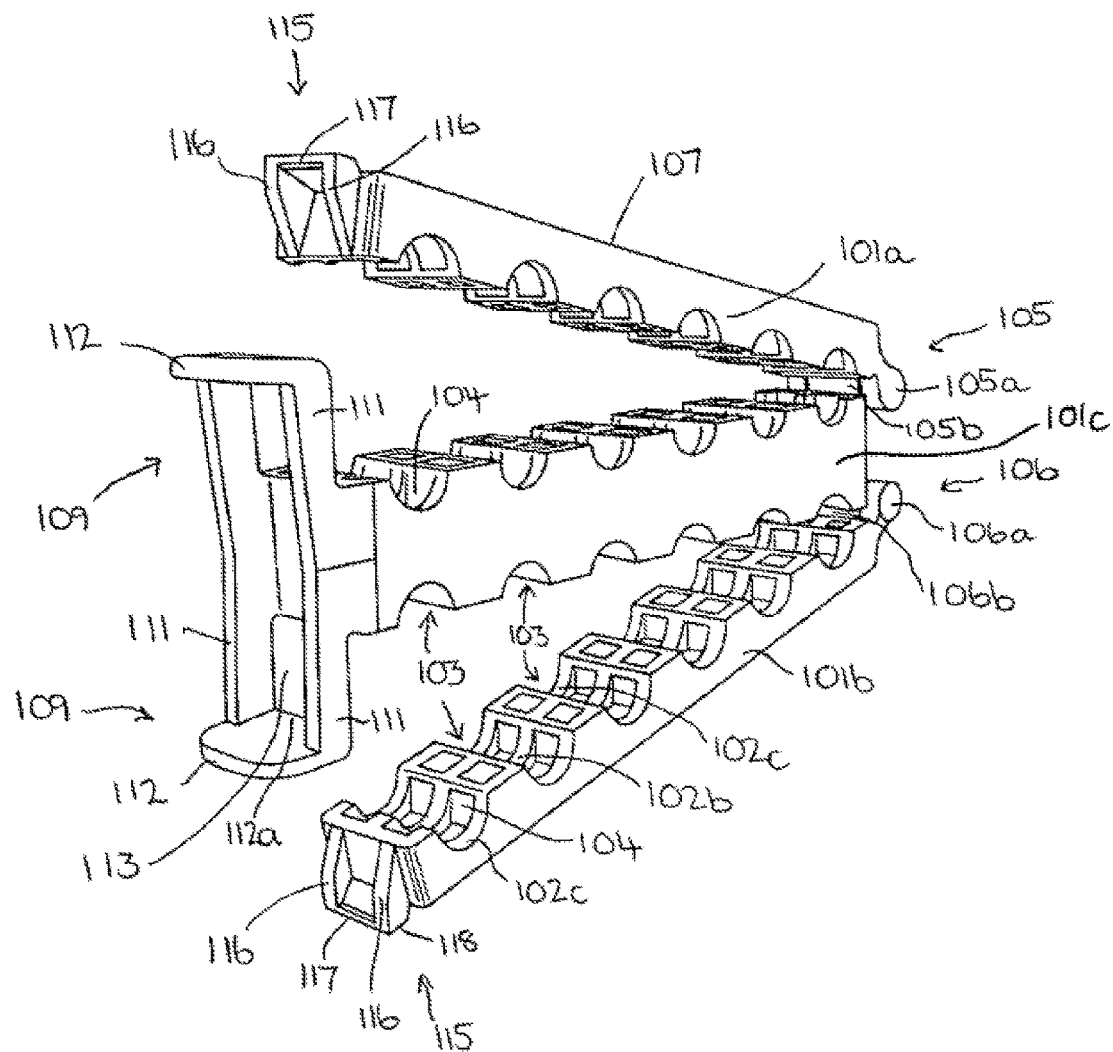
FIG. 11 is a schematic illustration of a cable clip of the first embodiment of the invention.
Figure 12:
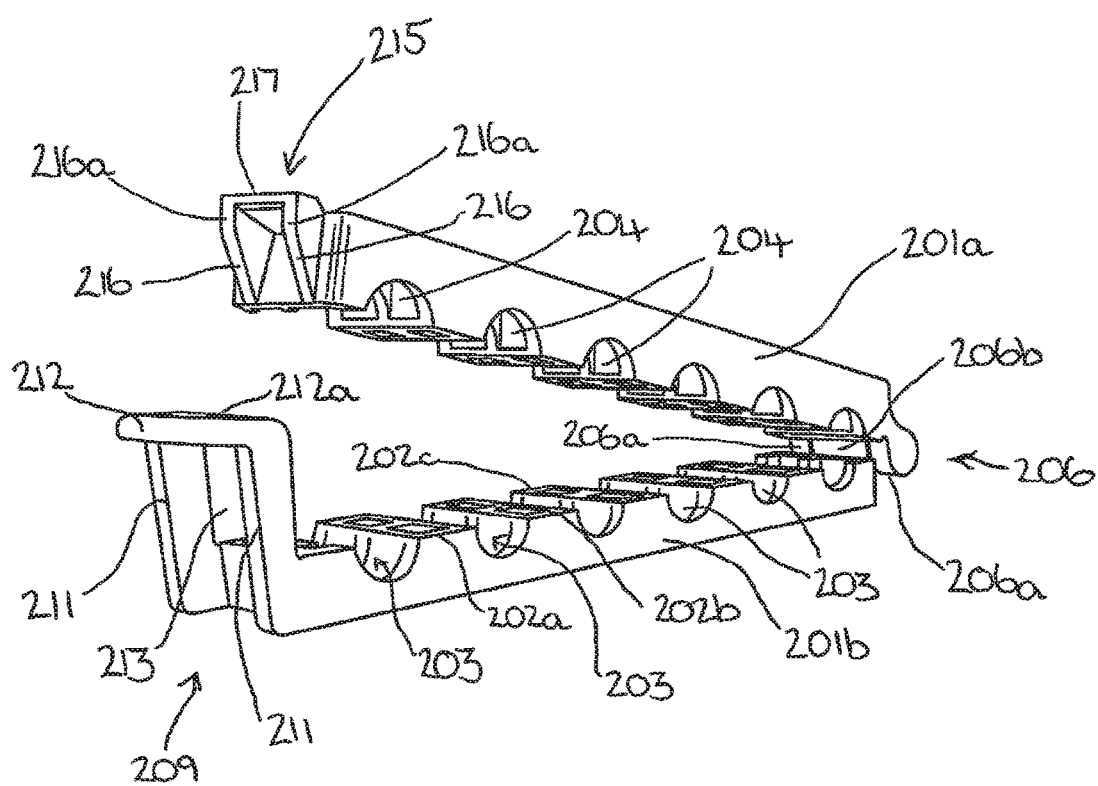
FIG. 12 is a schematic illustration of a cable clip of a fourth embodiment of the invention.
Figure 13:
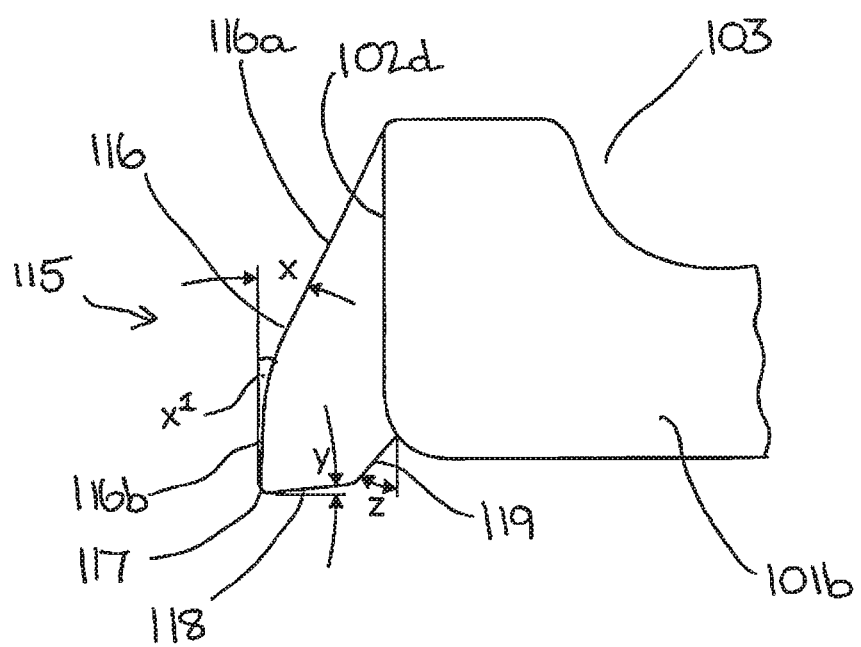
FIG. 13 is a side view of a component of the cable clips shown in FIGS. 11 and 12.

FIGS. 11 to 13 illustrate two styles of cable clip. The cable clip shown in FIG. 12 holds a set of cables associated with one row of ports, whereas the cable clip shown in FIG. 11 holds two sets of cable clips each set associated with one row of ports.

The cable clip 100 shown in FIG. 11 is similar to that shown in FIGS. 6a to 6d.

The cable clip 200 shown in FIGS. 12, 12a and 12b is similar to that shown in FIGS. 2a to 2c and comprises first and second members 201a, 201b joined together at one end by a hinge 206. The hinge 206 is provided by an outer portions 206a comprised in the first member and a central portion 206b comprised in the second member. Typically the opposing faces of the outer and central portions include respectively one of a protrusion and an indent providing a male/female connection. The material from which the cable clip is formed permits that parts 206a, 206b to fit together as a snap fit.

The first and second members 201a, 201b together provide a plurality of semi-circular cable receiving openings 203 which are aligned so that when the clip is closed as shown in FIGS. 12a, 12b circular openings are formed.

As can be seen from FIG. 12, each of the first and second members 201a, 201b comprises three spaced apart walls 202a, 202b, 202c, the walls 202a and 202c being situated to outer edges of the first and second members and the wall 202b being situated centrally therebetween. The semi-circular openings are formed in each of the walls 202a, 202b, 202c. Each we all 202a-202c extends perpendicularly from an inner surface of a wall 207. The wall 207 provides an flat surface which may receive label. The wall 207 may include a recessed area 207a which may be dimensioned so as to receive a label therein. The advantage to providing a recess in the wall 207 to receive the label is that the label is less likely to be removed inadvertently than if the it were placed on a flat surface.

Walls 204 extend between and perpendicular to the walls 202a, 202b and 202c to each side of the semi-circular openings 203 (note for the sake of clarity not all the walls 204 are illustrated).

The clip is closed by a fastening means comprising a fastener 209 and a protrusion 215. To close the fastening means the first and second members 201a, 201b are pressed together which causes the fastener 209 to ride over the protrusion 215 as described in greater detail below. To release the fastening means the fastener 209 is prised away from the protrusion 215 to release it therefrom.

FIG. 11 illustrates an alternative embodiment of a cable clip. The cable clip 100 comprises two first members 101a, 101b and two second members formed as an integral component 101c. Semi-circular openings 103 are provided on opposing sides of the component 101c, these semi-circular openings being aligned with semi-circular openings 103 in the first members 101a, 101b. Each first member 101a, 101b is hinged to the second member 101c by hinges 105, 106 which include outer and central portions 105a, 105b, 106a, 106b and which function in the same manner as the hinge 206 described above in relation to FIG. 12.

As can be seen from FIG. 11, each of the first and second members 101a, 101b comprises three spaced apart walls 102a, 102b, 102c, the walls 102a and 102c being situated to outer edges of the first and second members and the wall 102b being situated centrally therebetween. The semi-circular openings are formed in each of the walls 102a, 102b, 102c. Each we all 102a-102c extends perpendicularly from an inner surface of a wall 107. The wall provides an flat surface which may receive label which may include a recessed area in the same manner as described with reference to FIG. 12b.

Walls 104 extend between and perpendicular to the walls 102a, 102b and 102c to each side of the semi-circular openings 103 (note for the sake of clarity not all the walls 104 are illustrated).

The clip is closed by a fastening means comprising fasteners 109 and corresponding protrusions 115. To close the fastening means the first and second members 101a, 101b are pressed together which causes the fastener 109 to ride over the protrusion 115 as described in greater detail below. To release the fastening means the fastener 109 is prised away from the protrusion 115 to release it therefrom.

FIG. 13 illustrates the protrusion 115 (note protrusion 215 is identical to the protrusion 115) in greater detail and is referred to in conjunction with FIGS. 11 and 12, 12 and 12b. The protrusion 115 comprises side walls 116 which extend from and are joined to an end wall 101d, 102d. The side walls 116 are connected together by a wall 118. In the illustrated embodiment the wall 118 lies at a small angle y to a longitudinal axis lying parallel with the wall 107 of the first or member 101a, 101b. Typically the angle y is between 5 degrees and 20 degrees and more preferably between 10 degrees and 15 degrees and most preferable about 12.5 degrees.

The wall 118 is connected to the end wall 102d by wall 119 which lies at an angle z to the wall 102d. Typically the angle z is between 30 degrees and 60 degrees and more preferably between 40 degrees and 50 degrees and most preferable about 45 degrees.

The wall 118 presents a free edge 117 which the fastener rides over to fasten the first and second members of the cable clip together.

The side walls 116 include a first part 116a which has a face lying at an angle x to an axis lying parallel with the wall 102d. Typically the angle x is between 15 degrees and 45 degrees and more preferably between 20 degrees and 35 degrees and most preferable about 27 degrees.

The wall 116 includes a second part 116b which lies at an angle $x^1$ to the axis lying parallel with the wall 102d. Typically the angle $x^1$ is between 1.5 degrees and 10 degrees and more preferably between 1.5 degrees and 5 degrees and most preferable about 3.5 degrees.

The fastener 109 (or 209) includes side walls 111 (211) and a connecting wall 112 (212) which connects the side walls 111 (211). The connecting wall 112 (212) provides a rear edge 112a (212a). The connecting wall 112 (212) may be regarded as a prise portion, a user engaging this part to prise open the fastening means.

The fastening means operates as follows.

When a first member is pushed towards a second member the first part 116a of the walls 116 engages the rear edge 112a of the connecting wall 112. The rear edge 112a rides over the surface 116a causing the walls 111 and the first member 101a to bend as the rear edge 112a rides over the first part 116a of the wall 116. With continued pushing together of the first and second members the rear edge 112a rides over the second part 116b of the wall 116 until the rear edge 112a passes over the free edge 117. The bend formed in the walls 111 and the first member 101a (and to a lesser extent 101b) is release and the protrusion 115 (215) sits in the opening 113 (213) with the free edge 117 forward of the rear edge 112a (212a) of the fastener 109 (209).

The fastening means is released by pushing the fastener 109 away from the protrusion 115. As best shown in FIG. 12b, the wall 212 is provided with a series of ribs 212c, which aid grip. At least the rib closet to the edge of the wall 212 has an arrow shape 212d indicating the direction in which a force should be applied to release the fastening means.

The advantage of setting the wall 118 at a small angle y is that release of the fastener from the protrusion is easier because the wall 212 only needs to ride over the point contact along edge 117. Were the walls 118 and 212 parallel it would be necessary to rotate parallel walls over one another.

Setting the wall 119 at angle z allows the user to grip the closed cable clip and push on the wall 212, in particular the ribs 212c with the thumb without forward movement of thumb being encumbered by parts of the clip.

The small angle $x^1$ of the part 116b of side walls 116 ensures that that free edge 117 has a greater thickness of material behind it than would be the case if the whole of the wall 116 were at an angle x. The free edge 117 is subject to bending forces as the fastener rides over the protrusion and hence it is preferred that the material present behind the edge 117 is sufficient to resist forces applied thereto.

The cable clip of the invention will make the task of a technician much simpler, saving time and hence cost. It will also reduce the risk of cables being inserted into incorrect ports therefore reducing errors, downtime and consequently even more time and cost.

The principle and mode of operation of this invention have been explained and illustrated in its preferred embodiment. However, it must be understood that this invention may be practiced otherwise than as specifically explained and illustrated without departing from its spirit or scope.

What is claimed is:

1. A cable clip configured to receive a plurality of cables, the clip comprising:

elongate first and second members that are joined together pivotally at respective ends thereof; and a plurality of cable receiving openings adapted to receive and grip a cable located therein; wherein the first and second members each include a flat surface extending laterally with respect to a longitudinal axis of the clip and at least one wall extending perpendicularly with respect to the flat surface and toward the other of the first and second members and in the direction of the longitudinal axis of the clip, and the cable receiving openings are formed in the walls;

a part of each cable receiving opening is formed in the wall of the first member and the wall of the second member, and the parts of cable receiving openings in the wall of one of the members align with the parts of cable receiving openings in the wall of the other of the members;

the clip further includes fastening means adapted to releasably fasten together the first and second members; and the fastening means includes a fastener and a protrusion, the fastener extending from the other end of the first member with the fastener directly adjacent an end face of the second member when the cable clip is in a closed configuration and a free end of said fastener situated beyond the flat surface of the second member when the cable clip is in a closed configuration, and the protrusion extending from the other end of the second member, wherein the fastener releasably engages the protrusion and wherein the fastener includes a prise portion extending to one side of the fastener at the free end thereof along the longitudinal axis away from the hinge; wherein the protrusion includes a free edge, a part of the fastener being adapted to ride over the free edge of the protrusion;

said protrusion includes two spaced apart sidewalls;

each side wall includes first and second angled surfaces, the first angled surface extending from the free edge to the second angled surface; and the first and second angled surfaces lie at different angles to an axis extending perpendicular to the longitudinal axis of the clip, the first angle being smaller than the second.

2. A cable clip according to claim 1, said two spaced apart side walls have a connecting wall extending therebetween, said connecting wall comprising the free edge and the fastener being adapted to ride over the free edge.

3. A cable clip according to claim 1, wherein the fastener comprises two spaced apart side walls connected together by a connecting wall, wherein the connecting wall comprises a rear edge, and wherein the clip is configured such that under the application of force in a first direction the rear edge rides over the free edge of the protrusion to fasten the fastening means and under the application of force in another direction the rear edge of the fastener rides over the free edge of the protrusion to release the fastening means.

4. A cable clip according to claim 3, wherein the connecting wall of the fastener provides the prise portion.

5. A cable clip according to claim 1, wherein the first and second members are joined together by a hinge.

6. A cable clip according to claim 1, wherein the at least one cable receiving opening is substantially round in cross-section.

7. A cable clip according to claim 1, wherein the at least one opening in at least one of the first and second members is substantially an elongated semi-circle.

8. A cable clip according to claim 1, wherein the at least one cable receiving opening is lined with a compressible material.

9. A cable clip according to claim 1, wherein a space between centers of adjacent openings corresponds to a space between centers of adjacent cable receiving ports.

10. A cable clip according to claim 1, further including a lock configured to lock the clip in a closed configuration.

* * * * *